United States Patent
Yeh et al.

(10) Patent No.: US 10,204,896 B2
(45) Date of Patent: Feb. 12, 2019

(54) VERTICAL DOUBLE DIFFUSION METAL-OXIDE-SEMICONDUCTOR POWER DEVICE

(71) Applicant: Leadtrend Technology Corp., Hsinchu County (TW)

(72) Inventors: Jen-Hao Yeh, Hsinchu County (TW); Chiung-Feng Chou, Hsinchu County (TW)

(73) Assignee: Leadtrend Technology Corp., Hsinchu County (TW)

(*) Notice: Subject to any disclaimer, the term of this patent is extended or adjusted under 35 U.S.C. 154(b) by 0 days.

(21) Appl. No.: 15/841,301

(22) Filed: Dec. 14, 2017

(65) Prior Publication Data
US 2018/0175019 A1 Jun. 21, 2018

Related U.S. Application Data

(60) Provisional application No. 62/435,085, filed on Dec. 16, 2016.

(51) Int. Cl.
| | |
|---|---|
| H01L 27/02 | (2006.01) |
| H01L 23/34 | (2006.01) |
| H01L 29/78 | (2006.01) |
| H01L 21/265 | (2006.01) |
| H01L 29/06 | (2006.01) |
| H01L 21/762 | (2006.01) |

(52) U.S. Cl.
CPC .... H01L 27/0248 (2013.01); H01L 21/26513 (2013.01); H01L 21/76202 (2013.01); H01L 23/34 (2013.01); H01L 29/0649 (2013.01); H01L 29/7805 (2013.01); H01L 29/7811 (2013.01)

(58) Field of Classification Search
CPC combination set(s) only.
See application file for complete search history.

(56) References Cited

U.S. PATENT DOCUMENTS

2004/0075103 A1 4/2004 Topp
2015/0228640 A1* 8/2015 Koo ................... H01L 29/0634
257/334

FOREIGN PATENT DOCUMENTS

TW 201112419 A1 4/2011

* cited by examiner

*Primary Examiner* — Ratisha Mehta
(74) *Attorney, Agent, or Firm* — Winston Hsu (57) ABSTRACT

A vertical double diffusion metal-oxide-semiconductor power device with thermal sensitivity unit includes a vertical double diffusion metal-oxide-semiconductor power transistor and at least one thermal sensitivity unit. The vertical double diffusion metal-oxide-semiconductor power transistor includes a first metal layer, a substrate layer, an epitaxy layer, a second metal layer, and a plurality of first polysilicon layers, wherein each first polysilicon layer of the plurality of first polysilicon layers corresponds to a first oxide layer, a first doping well and a second doping well with second conductivity type, a first doped region and a second doped region with first conductivity type, and a second oxide layer. The at least one thermal sensitivity unit is used for detecting a temperature when the vertical double diffusion metal-oxide-semiconductor power transistor operates, and the vertical double diffusion metal-oxide-semiconductor power transistor and the at least one thermal sensitivity unit share a same process.

10 Claims, 6 Drawing Sheets

VERTICAL DOUBLE DIFFUSION METAL-OXIDE-SEMICONDUCTOR POWER DEVICE

CROSS REFERENCE TO RELATED APPLICATIONS

This application claims the benefit of U.S. Provisional Application No. 62/435,085, filed on Dec. 16, 2016 and entitled "Power Semiconductor Devices Embedded Thermal Sensitivity Cells," the contents of which are incorporated herein by reference.

BACKGROUND OF THE INVENTION

1. Field of the Invention

The present invention relates to a vertical double diffused metal-oxide-semiconductor (VDMOS) power device, and particularly to a VDMOS power device with thermal sensitivity unit.

2. Description of the Prior Art

When an integrated circuit operates, the prior art utilizes a temperature sensing device which is in a same package with the integrated circuit to sense a temperature of the integrated circuit. Then, the temperature sensing device transmits the temperature to the integrated circuit, and the integrated circuit determines whether to enable over-temperature protection within the integrated circuit according to the temperature and a reference temperature. Although the temperature sensing device and the integrated circuit are packaged in the same package together, because the temperature sensing device is not integrated into the integrated circuit, an actual temperature of the integrated circuit may be much higher than the reference temperature when the integrated circuit enables the over-temperature protection within the integrated circuit according to the temperature and the reference temperature. That is to say, in the prior art, the integrated circuit may be burned down before the over-temperature protection within the integrated circuit is enabled. Therefore, the prior art is not a better solution for the integrated circuit.

SUMMARY OF THE INVENTION

An embodiment of the present invention provides a vertical double diffused metal-oxide-semiconductor (VDMOS) power device with thermal sensitivity unit. The VDMOS power device includes a VDMOS power transistor and at least one thermal sensitivity unit. The VDMOS power transistor includes a first metal layer, a substrate layer with first conductivity type, an epitaxy layer with first conductivity type, a second metal layer, and a plurality of first polysilicon layers. The substrate layer is formed on the first metal layer. The epitaxy layer is formed on the substrate layer. Each first polysilicon layer of the plurality of first polysilicon layers corresponds to a first oxide layer, a first doping well and a second doping well with second conductivity type, a first doped region and a second doped region with first conductivity type, and a second oxide layer, wherein the first oxide layer is formed on the epitaxy layer, the first doping well and the second doping well are formed within the epitaxy layer, the first doped region and the second doped region are formed within the first doping well and the second doping well respectively, the each first polysilicon layer is formed on the first oxide layer, the second oxide layer covers the each first polysilicon layer, and the second metal layer is formed on the first doping well, the second doping well, the first doped region, the second doped region, and the second oxide layer. The at least one thermal sensitivity unit is formed on the epitaxy layer for detecting a temperature of the VDMOS power transistor when the VDMOS power transistor operates, and the VDMOS power transistor and the at least one thermal sensitivity unit share a same process.

The present invention provides a VDMOS power device. The VDMOS power device utilizes a same process to integrate a VDMOS power transistor and at least one thermal sensitivity unit into the VDMOS power device. Because the at least one thermal sensitivity unit is formed next to the VDMOS power transistor, an equivalent forward bias of the at least one thermal sensitivity unit is quickly reversely changed with an operation temperature of the VDMOS power transistor. That is to say, a controller of the VDMOS power device can quickly determine whether to enable over-temperature protection within the VDMOS power device according to variation of the equivalent forward bias of the at least one thermal sensitivity unit and an over-temperature protection reference temperature. Therefore, compared to the prior art, because the controller of the VDMOS power device can quickly determine whether to enable the over-temperature protection within the VDMOS power device, the present invention does not have a disadvantage of the prior art enabling the over-temperature protection within the VDMOS power device too late.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
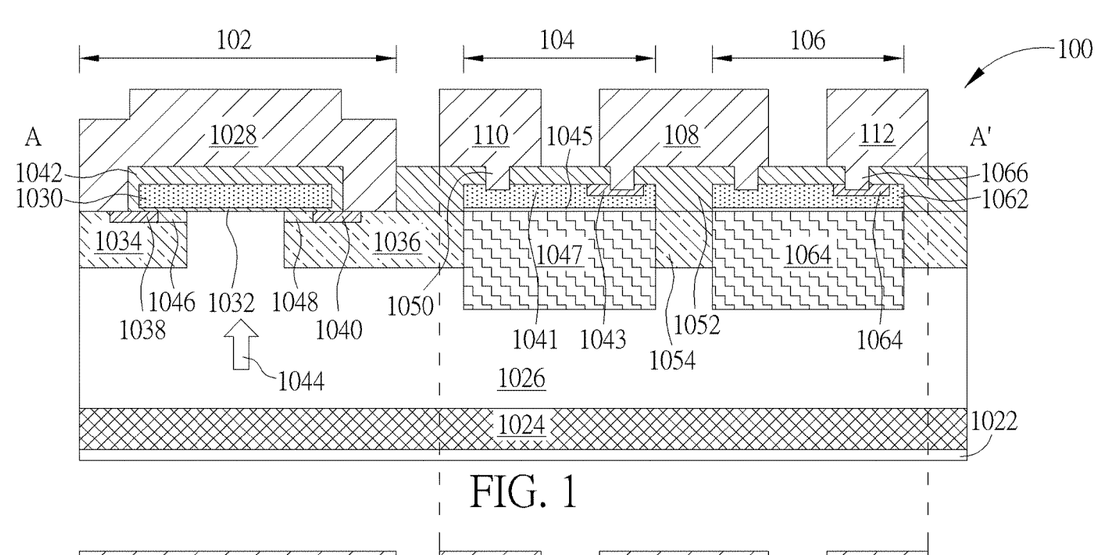
FIG. 1 is a diagram illustrating a cross section of a vertical double diffused metal-oxide-semiconductor (VDMOS) power device with thermal sensitivity unit according to a first embodiment of the present invention.

Please refer to FIG. 1. FIG. 1 is a diagram illustrating a cross section of a vertical double diffused metal-oxide-semiconductor (VDMOS) power device 100 with thermal sensitivity unit according to a first embodiment of the present invention. As shown in FIG. 1, the VDMOS power device 100 includes a VDMOS power transistor 102 and thermal sensitivity units 104, 106. But, the present invention is not limited to the VDMOS power device 100 including one VDMOS power transistor and two thermal sensitivity units, that is, the VDMOS power device 100 can include more than one VDMOS power transistor and more than one thermal sensitivity unit. As shown in FIG. 1, the VDMOS power transistor 102 includes a first metal layer 1022, a substrate layer 1024 with first conductivity type, an epitaxy layer 1026 with first conductivity type, a second metal layer 1028, and a first polysilicon layer 1030 of a plurality of first polysilicon layers. As shown in FIG. 1, the substrate layer 1024 is formed on the first metal layer 1022. The epitaxy layer 1026 is formed on the substrate layer 1024. The first polysilicon layer 1030 corresponds to a first oxide layer 1032, a first doping well 1034 and a second doping well 1036 with second conductivity type, a first doped region 1038 and a second doped region 1040 with first conductivity type, and a second oxide layer 1042, wherein the first oxide layer 1032 is formed on the epitaxy layer 1026, the first doping well 1034 and the second doping well 1036 are formed within the epitaxy layer 1026, the first doped region 1038 and the second doped region 1040 are formed within the first doping well 1034 and the second doping well 1036 respectively, the first polysilicon layer 1030 is formed on the first oxide layer 1032, the second oxide layer 1042 covers the first polysilicon layer 1030, and the second metal layer 1028 is formed on the first doping well 1034, the second doping well 1036, the first doped region 1038, the second doped region 1040, and the second oxide layer 1042. In addition, the first conductivity type is N type and the second conductivity type is P type, and ion concentration of the substrate layer 1024 is greater than ion concentration of the epitaxy layer 1026. In addition, the first doping well 1034 and the second doping well 1036 are formed by a self-align method according to the first polysilicon layer 1030. That is to say, after the first polysilicon layer 1030 is formed, the first doping well 1034 and the second doping well 1036 can be formed through the first polysilicon layer 1030 (that is, a self-align) and an ion implantation method without an addition mask.

As shown in FIG. 1, the first metal layer 1022 is a drain of the VDMOS power transistor 102, the plurality of first polysilicon layers is a gate of the VDMOS power transistor 102, and the second metal layer 1028 is a source of the VDMOS power transistor 102. Therefore, when the VDMOS power transistor 102 is turned on, a current 1044 flows from the first metal layer 1022 (the drain of the VDMOS power transistor 102) through the substrate layer 1024, the epitaxy layer 1026, channels 1046, 1048, and the first doped region 1038 and the second doped region 1040 to the second metal layer 1028 (the source of the VDMOS power transistor 102). In addition, the VDMOS power transistor 102 utilizes a depletion region (not shown in FIG. 1) formed by a PN junction between the first doping well 1034 and the epitaxy layer 1026 and a depletion region (not shown in FIG. 1) formed by a PN junction between the second doping well 1036 and the epitaxy layer 1026 to endure a voltage between the drain and the source of the VDMOS power transistor 102. In one embodiment of the present invention, a width of the first polysilicon layer 1030 needs to make the depletion region formed by the PN junction between the first doping well 1034 and the epitaxy layer 1026 and the depletion region formed by the PN junction between the second doping well 1036 and the epitaxy layer 1026 be merged together. That is to say, the width of first polysilicon layer 1030 cannot be greater than a threshold, wherein if the width of first polysilicon layer 1030 is greater than the threshold, the width of first polysilicon layer 1030 cannot make the depletion region formed by the PN junction between the first doping well 1034 and the epitaxy layer 1026 and the depletion region formed by the PN junction between the second doping well 1036 and the epitaxy layer 1026 be merged together.

As shown in FIG. 1, the thermal sensitivity unit 104 includes a second polysilicon layer 1041 and a doped region 1043, wherein the doped region 1043 is formed within the second polysilicon layer 1041, the second polysilicon layer 1041 is formed on a third oxide layer 1045, the third oxide layer 1045 is formed on a deep doping well 1047 with second conductivity type, and the deep doping well 1047 is formed within the epitaxy layer 1026. As shown in FIG. 1, the thermal sensitivity unit 104 is a diode (i.e. a PN junction), wherein a forward bias of the thermal sensitivity unit 104 is reversely changed with a temperature (that is, the forward bias of the thermal sensitivity unit 104 is reduced with increase of the temperature). In addition, as shown in FIG. 1, a structure of the thermal sensitivity unit 106 is the same as a structure of the thermal sensitivity unit 104, so further description thereof is omitted for simplicity. As shown in FIG. 1, the thermal sensitivity unit 104 is electrically connected to a polysilicon layer 1062 of the thermal sensitivity unit 106 through the doped region 1043 and a connection 108. That is to say, the thermal sensitivity unit 104 is electrically connected to the thermal sensitivity unit 106 in series to form a thermal sensitivity device, wherein the second polysilicon layer 1041 is electrically connected to a first electrode (anode) 110 through a first contact 1050 and a doped region 1064 of the thermal sensitivity unit 106 is electrically connected to a second electrode (cathode) 112 through a second contact 1066, an equivalent forward bias of the thermal sensitivity device is a sum of the forward bias of the thermal sensitivity unit 104 and a forward bias of the thermal sensitivity unit 106, and the first contact 1050 and the second contact 1066 are formed within a fourth oxide layer 1052. In addition, the substrate layer 1024, the epitaxy layer 1026, the first doping well 1034, the second doping well 1036, the first doped region 1038, the second doped region 1040, the deep doping well 1047, and the doped regions 1043, 1064 are formed through the ion implantation method. In addition, a function of the deep doping well 1047 can make the depletion region formed by the PN junction between the second doping well 1036 and the epitaxy layer 1026 and a depletion region formed by a PN junction between a doping well 1054 and the epitaxy layer 1026 be merged together. In addition, as shown in FIG. 1, the thermal sensitivity device is not electrically connected to the VDMOS power transistor 102. In addition, the VDMOS power device 100 further includes a passivation layer (not shown in FIG. 1) formed on the second metal layer 1028, the first electrode 110, the second electrode 112, and the connection 108.

Figure 2:
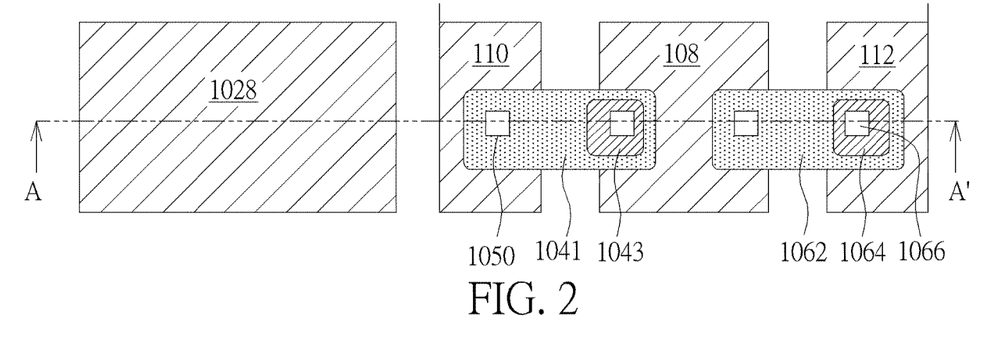
FIG. 2 is a diagram illustrating a top view corresponding to FIG. 1.
Figure 3:
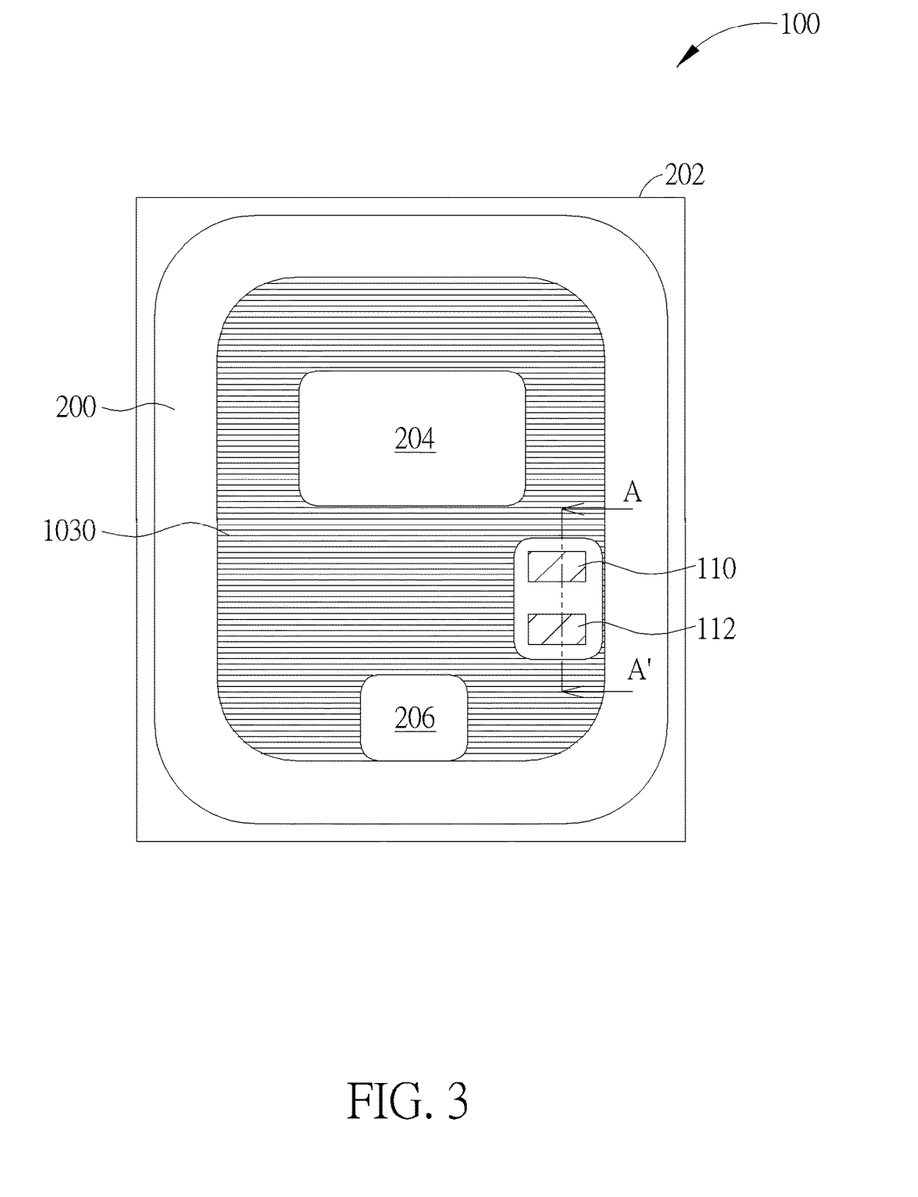
FIG. 3 is a diagram illustrating a top view of the VDMOS power device.

In addition, FIG. 2 is a diagram illustrating a top view corresponding to FIG. 1, and FIG. 3 is a diagram illustrating a top view of the VDMOS power device 100, wherein FIG. 1 corresponds to a straight line AA' shown in FIG. 3. As shown in FIG. 3, the VDMOS power device 100 further includes an isolation region 200 for surrounding the VDMOS power transistor 102 and the thermal sensitivity device shown in FIG. 1. In addition, as shown in FIG. 3, a seal ring 202 surrounds the isolation region 200, wherein the seal ring 202 has a shielding effect of electromagnetic interference (EMI) and a function of isolating noise outside the VDMOS power device 100. In addition, FIG. 3 also shows a pad 204 corresponds to the source of the VDMOS power transistor 102 and a pad 206 corresponds to the gate of the VDMOS power transistor 102.

Figure 4:
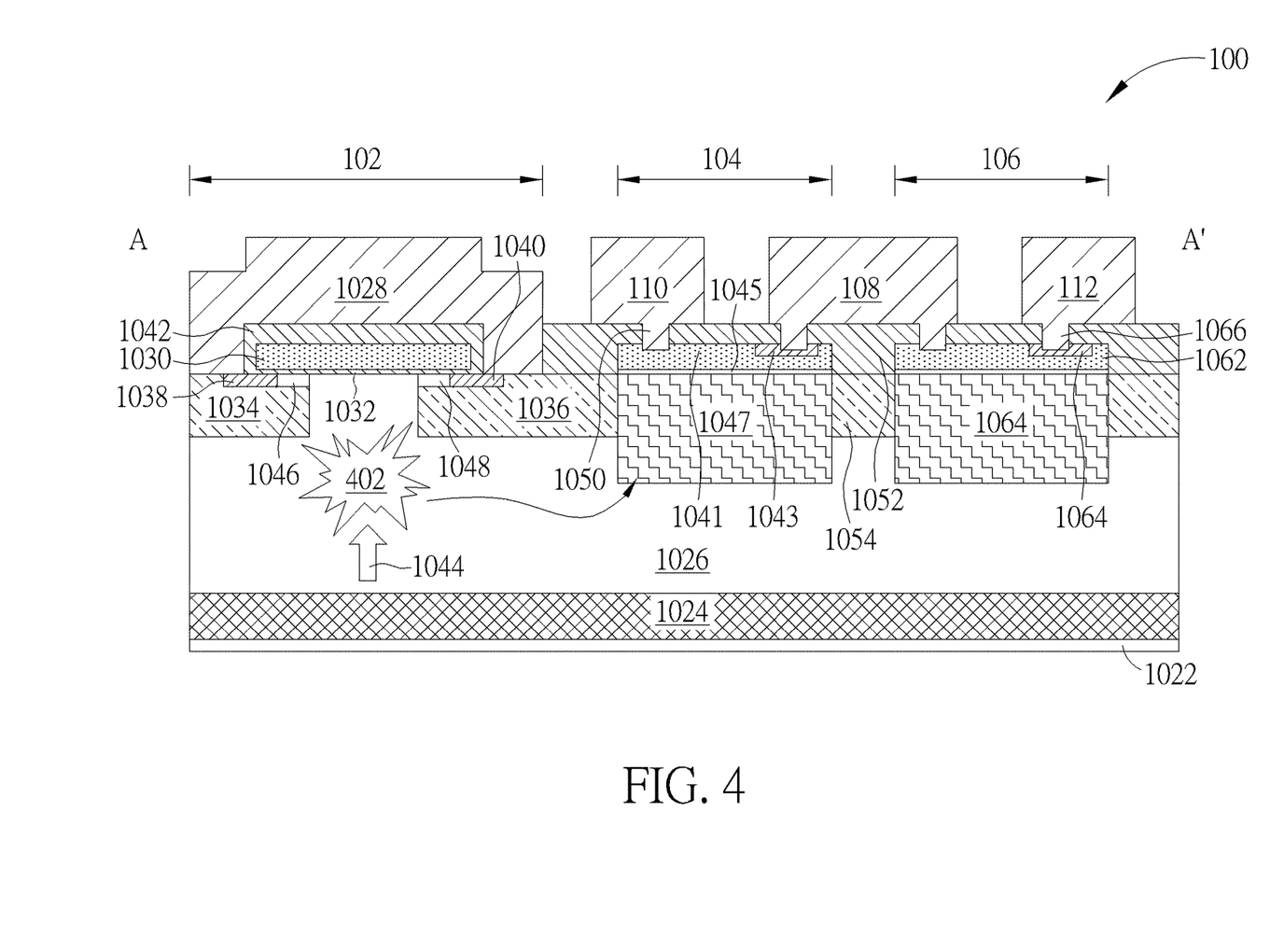
FIG. 4 is a diagram illustrating the thermal sensitivity device detecting a temperature of the VDMOS power transistor when the VDMOS power transistor operates.

Please refer to FIG. 4. FIG. 4 is a diagram illustrating the thermal sensitivity device detecting a temperature of the VDMOS power transistor 102 when the VDMOS power transistor 102 operates. As shown in FIG. 4, when the VDMOS power transistor 102 operates, a path which the current 1044 flows through will generate a heat source 402. Because the thermal sensitivity device is formed next to the VDMOS power transistor 102, and a material (i.e. Si) for forming the epitaxy layer 1026, the second doping well 1036, and the deep doping well 1047 has better thermal conductivity, the equivalent forward bias of the thermal sensitivity device is quickly reversely changed with an operation temperature of the VDMOS power transistor 102. Therefore, a controller (not shown in FIG. 4) of the VDMOS power device 100 can quickly determine whether to enable over-temperature protection within the VDMOS power device 100 according to variation of the equivalent forward bias of the thermal sensitivity device and an over-temperature protection reference temperature, wherein the controller determining an operation temperature of the VDMOS power device 100 according to the variation of the equivalent forward bias of the thermal sensitivity device is obvious to one ordinary skill in the art, so further description thereof is omitted for simplicity.

In addition, as shown in FIG. 1, although the VDMOS power transistor 102 and the thermal sensitivity units 104, 106 are integrated into the VDMOS power device 100, but the VDMOS power transistor 102 and the thermal sensitivity units 104, 106 share a same process. For example, the same process includes a mask corresponding to active region, a mask corresponding to deep doping well, a mask corresponding to polysilicon layer, a mask corresponding to doped region, a mask corresponding to contact, a mask corresponding to second metal layer, and a mask corresponding to passivation layer. The mask corresponding to active region is used for defining the first doped region 1038 and the second doped region 1040; the mask corresponding to deep doping well is used for defining the deep doping well 1047 and the isolation region 200; the mask corresponding to polysilicon layer is used for defining the first polysilicon layer 1030, the second polysilicon layer 1041, and the polysilicon layer 1062; the mask corresponding to doped region is used for defining the doped regions 1043, 1064; the mask corresponding to contact is used for defining the first contact 1050 and the second contact 1066; the mask corresponding to second metal layer is used for defining the second metal layer 1028, the first electrode 110, the second electrode 112, and the connection 108; and the mask corresponding to passivation layer is used for defining the passivation layer.

Figure 5:
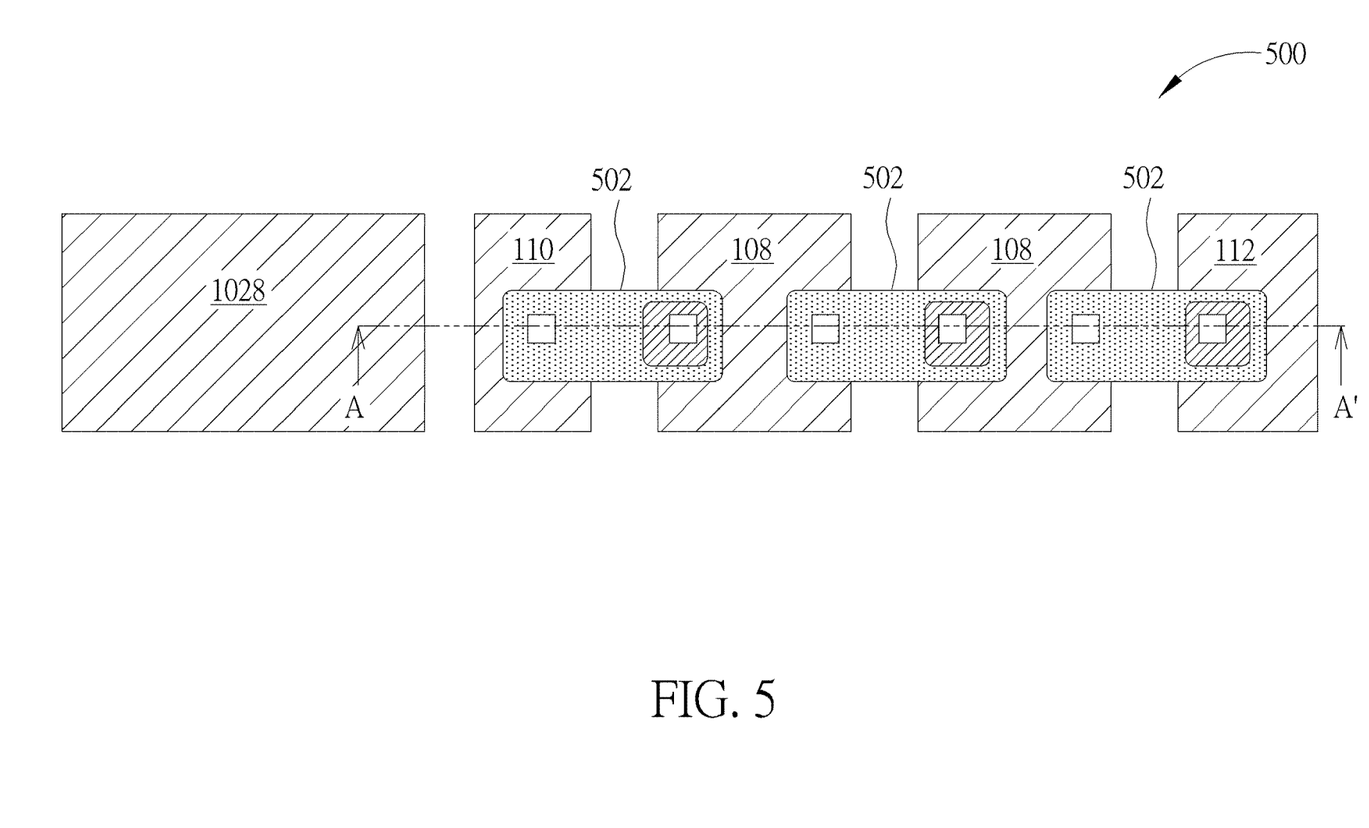
FIG. 5 is a diagram illustrating a top view of a VDMOS power device with thermal sensitivity unit according to a second embodiment of the present invention.
Figure 6:
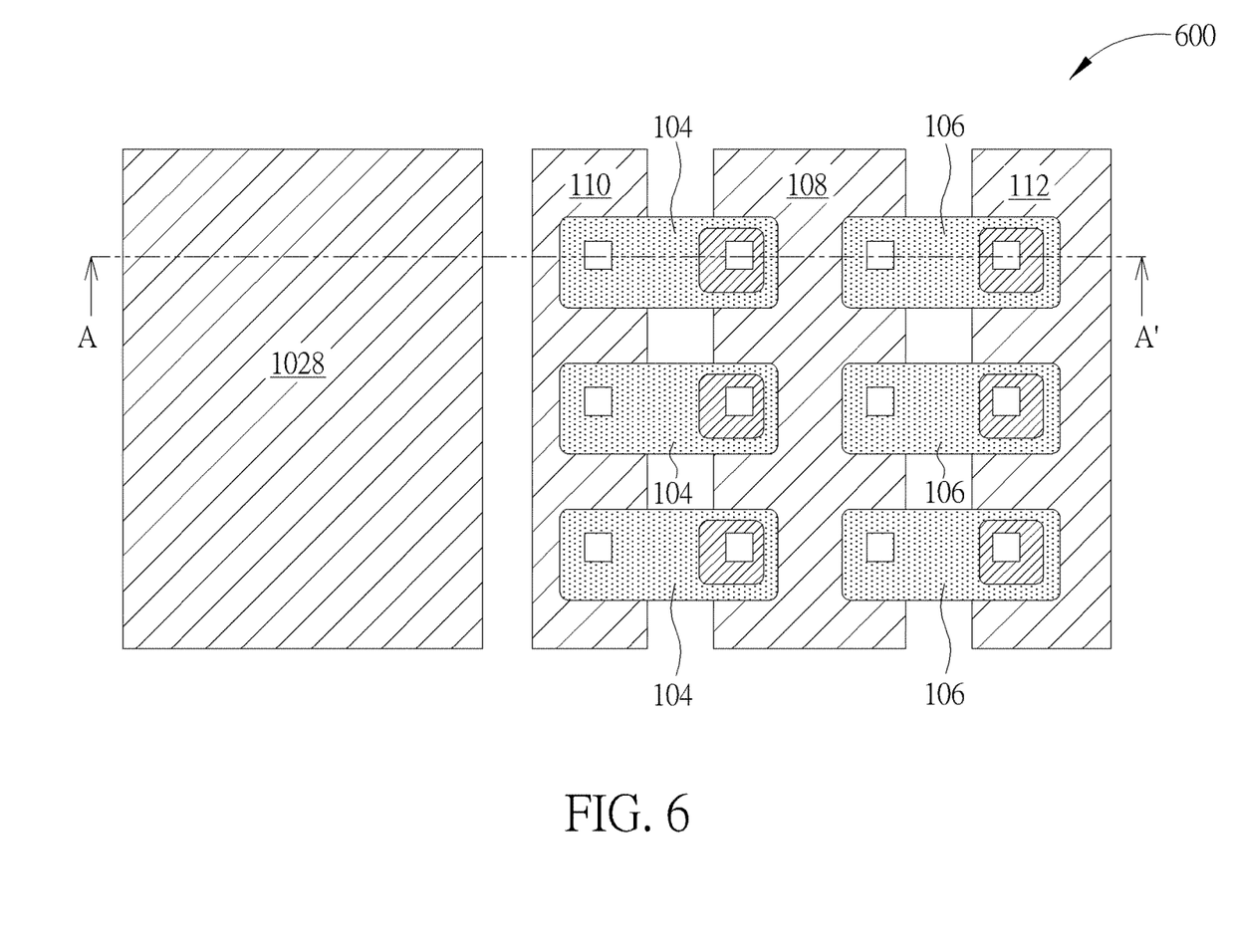
FIG. 6 is a diagram illustrating a top view of a VDMOS power device with thermal sensitivity unit according to a third embodiment of the present invention.

Please refer to FIGS. 5, 6. FIG. 5 is a diagram illustrating a top view of a VDMOS power device 500 with thermal sensitivity unit according to a second embodiment of the present invention, and FIG. 6 is a diagram illustrating a top view of a VDMOS power device 600 with thermal sensitivity unit according to a third embodiment of the present invention. As shown in FIG. 5, a difference between the VDMOS power device 500 and the VDMOS power device 100 is that a thermal sensitivity device of the VDMOS power device 500 is composed of three thermal sensitivity units 502 in series, so an equivalent forward bias of the thermal sensitivity device of the VDMOS power device 500 is a sum of forward biases of the three thermal sensitivity units 502. In addition, as shown in FIG. 6, a difference between the VDMOS power device 600 and the VDMOS power device 100 is that a thermal sensitivity device of the VDMOS power device 600 is composed of three thermal sensitivity devices of the VDMOS power device 100 in parallel, so an equivalent forward bias of the thermal sensitivity device of the VDMOS power device 600 is equal to one-third of the equivalent forward bias of the thermal sensitivity device of the VDMOS power device 100.

In addition, the present invention is not limited to the thermal sensitivity devices of the VDMOS power devices 100, 500, 600, that is, any configuration in which the VDMOS power devices 100, 500, 600 utilize the same process to integrate the VDMOS power transistor 102 with at least one thermal sensitivity unit falls within the scope of the present invention.

Figure 7:
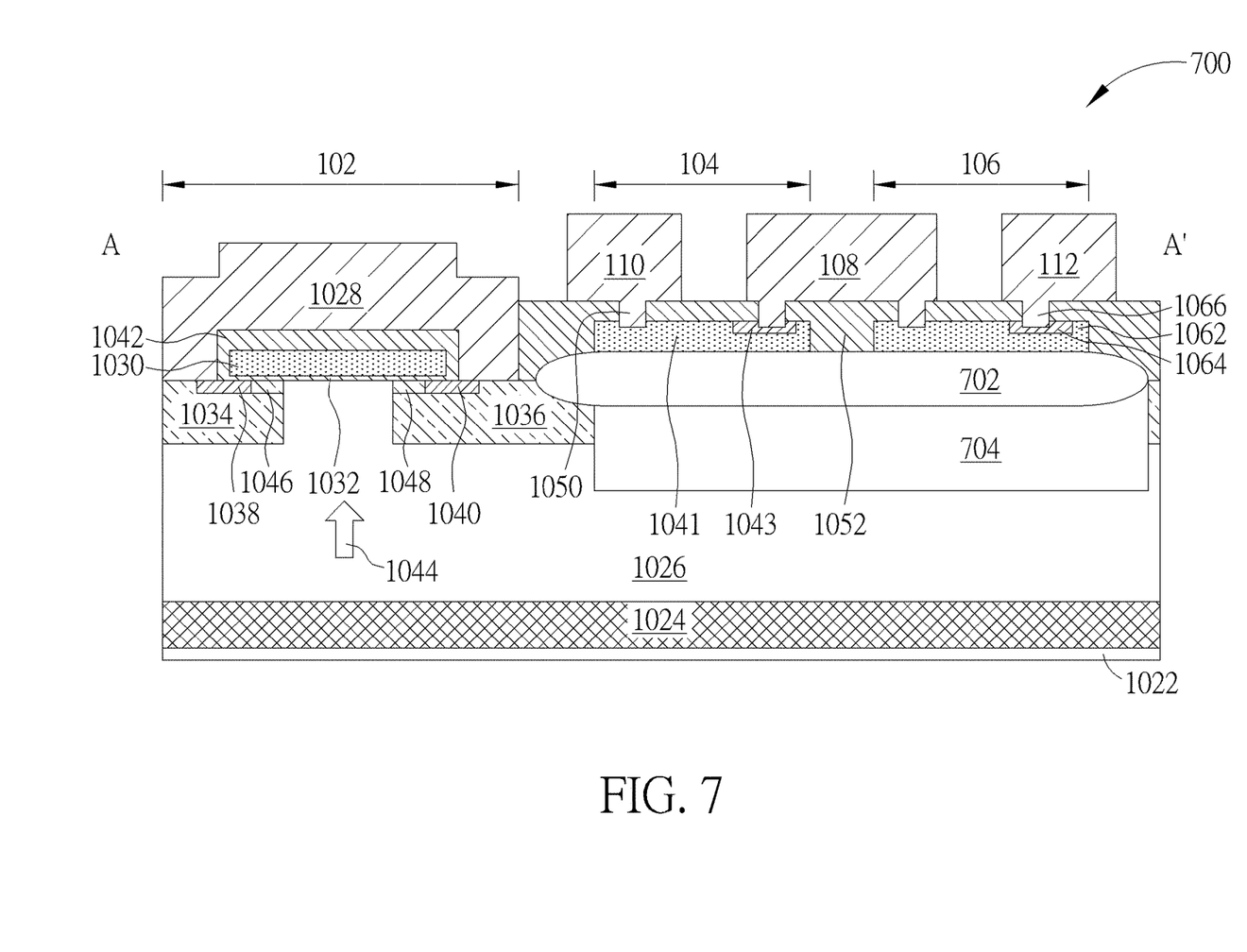
FIG. 7 is a diagram illustrating a cross section of a VDMOS power device with thermal sensitivity unit according to a fourth embodiment of the present invention.

Please refer to FIG. 7. FIG. 7 is a diagram illustrating a cross section of a VDMOS power device 700 with thermal sensitivity unit according to a fourth embodiment of the present invention. As shown in FIG. 7, differences between the VDMOS power device 700 and the VDMOS power device 100 are that the second polysilicon layer 1041 and the polysilicon layer 1062 are directly formed on a field oxide layer 702, the field oxide layer 702 is formed on a deep doping well 704, and the deep doping well 704 is formed within the epitaxy layer 1026, wherein the field oxide layer 702 is formed through a Local Oxidation of Silicon (LOCOS) method. In addition, a top view of the VDMOS power device 700 can be referred to FIGS. 2, 3. In addition, subsequent operational principles of the VDMOS power device 700 are the same as those of the VDMOS power device 100, so further description thereof is omitted for simplicity.

To sum up, the VDMOS power device utilizes the same process to integrate the VDMOS power transistor and at least one thermal sensitivity unit into the VDMOS power device. Because the at least one thermal sensitivity unit is formed next to the VDMOS power transistor, an equivalent forward bias of the at least one thermal sensitivity unit can be quickly reversely changed with the operation temperature of the VDMOS power transistor. That is to say, the controller of the VDMOS power device can quickly determine whether to enable the over-temperature protection within the VDMOS power device according to variation of the equivalent forward bias of the at least one thermal sensitivity unit and the over-temperature protection reference temperature. Therefore, compared to the prior art, because the controller of the VDMOS power device can quickly determine whether to enable the over-temperature protection within the VDMOS power device, the present invention does not have a disadvantage of the prior art enabling the over-temperature protection within the VDMOS power device too late.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A vertical double diffused metal-oxide-semiconductor (VDMOS) power device with thermal sensitivity unit, comprising:
   a VDMOS power transistor, comprising:
      a first metal layer;
      a substrate layer with first conductivity type formed on the first metal layer;
      an epitaxy layer with first conductivity type formed on the substrate layer;
      a second metal layer; and a plurality of first polysilicon layers, wherein each first polysilicon layer of the plurality of first polysilicon layers corresponds to a first oxide layer, a first doping well and a second doping well with second conductivity type, a first doped region and a second doped region with first conductivity type, and a second oxide layer, wherein the first oxide layer is formed on the epitaxy layer, the first doping well and the second doping well are formed within the epitaxy layer, the first doped region and the second doped region are formed within the first doping well and the second doping well respectively, the each first polysilicon layer is formed on the first oxide layer, the second oxide layer covers the each first polysilicon layer, and the second metal layer is formed on the first doping well, the second doping well, the first doped region, the second doped region, and the second oxide layer; and at least one thermal sensitivity unit formed on the epitaxy layer, wherein the at least one thermal sensitivity unit is used for detecting a temperature of the VDMOS power transistor when the VDMOS power transistor operates, and the VDMOS power transistor and the at least one thermal sensitivity unit share a same process, wherein each thermal sensitivity unit of the at least one thermal sensitivity unit comprises:

a second polysilicon layer formed on a third oxide layer; and a doped region formed within the second polysilicon layer;

wherein the third oxide layer is formed on a deep doping well with second conductivity type, and the deep doping well is formed within the epitaxy layer.

2. The VDMOS power device of claim 1, further comprising:

an isolation region, wherein the deep doping well and the isolation region share a mask.

3. The VDMOS power device of claim 1, wherein the substrate layer, the epitaxy layer, the first doping well, the second doping well, the first doped region, the second doped region, the deep doping well, and the doped region are formed through an ion implantation method.

4. A vertical double diffused metal-oxide-semiconductor (VDMOS) power device with thermal sensitivity unit, comprising:

a VDMOS power transistor, comprising:
  a first metal layer;
  a substrate layer with first conductivity type formed on the first metal layer;
  an epitaxy layer with first conductivity type formed on the substrate layer;
  a second metal layer; and
  a plurality of first polysilicon layers, wherein each first polysilicon layer of the plurality of first polysilicon layers corresponds to a first oxide layer, a first doping well and a second doping well with second conductivity type, a first doped region and a second doped region with first conductivity type, and a second oxide layer, wherein the first oxide layer is formed on the epitaxy layer, the first doping well and the second doping well are formed within the epitaxy layer, the first doped region and the second doped region are formed within the first doping well and the second doping well respectively, the each first polysilicon layer is formed on the first oxide layer, the second oxide layer covers the each first polysilicon layer, and the second metal layer is formed on the first doping well, the second doping well, the first doped region, the second doped region, and the second oxide layer; and at least one thermal sensitivity unit formed on the epitaxy layer, wherein the at least one thermal sensitivity unit is used for detecting a temperature of the VDMOS power transistor when the VDMOS power transistor operates, and the VDMOS power transistor and the at least one thermal sensitivity unit share a same process, wherein each thermal sensitivity unit of the at least one thermal sensitivity unit comprises:

a second polysilicon layer formed on a field oxide layer; and a doped region formed within the second polysilicon layer;

wherein the field oxide layer is formed on a deep doping well with second conductivity type, and the deep doping well is formed within the epitaxy layer.

5. The VDMOS power device of claim 4, wherein the field oxide layer is formed through a Local Oxidation of Silicon (LOCOS) method.

6. The VDMOS power device of claim 4, wherein the substrate layer, the epitaxy layer, the first doping well, the second doping well, the first doped region, the second doped region, the deep doping well, and the doped region are formed through an ion implantation method.

7. The VDMOS power device of claim 4, wherein the first metal layer is a drain of the VDMOS power transistor, the plurality of first polysilicon layers is a gate of the VDMOS power transistor, and the second metal layer is a source of the VDMOS power transistor.

8. The VDMOS power device of claim 4, wherein the first conductivity type is N type and the second conductivity type is P type.

9. The VDMOS power device of claim 4, wherein ion concentration of the substrate layer is greater than ion concentration of the epitaxy layer.

10. The VDMOS power device of claim 4, wherein the first doping well and the second doping well are formed by a self-align method according to the each first polysilicon layer.

* * * * *